United States Patent [19]
Ushida et al.

[11] Patent Number: 5,576,801
[45] Date of Patent: *Nov. 19, 1996

[54] PROJECTION EXPOSURE APPARATUS

[75] Inventors: Kazuo Ushida; Masaomi Kameyama, both of Tokyo, Japan

[73] Assignee: Nikon Corporation, Tokyo, Japan

[*] Notice: The term of this patent shall not extend beyond the expiration date of Pat. No. 5,530,518.

[21] Appl. No.: 480,863

[22] Filed: Jun. 7, 1995

Related U.S. Application Data

[63] Continuation of Ser. No. 370,216, Dec. 7, 1994, which is a continuation of Ser. No. 274,369, Jul. 13, 1994, abandoned, which is a continuation-in-part of Ser. No. 166,153, Dec. 14, 1993, abandoned, which is a continuation of Ser. No. 991,421, Dec. 16, 1992, abandoned.

[30] Foreign Application Priority Data

Dec. 25, 1991 [JP] Japan ................................. 3-343601

[51] Int. Cl.⁶ .......................... G03B 27/42; G03B 27/54
[52] U.S. Cl. ................................................ 355/53; 355/67
[58] Field of Search ................................ 355/43, 53, 71, 355/67

[56] References Cited

U.S. PATENT DOCUMENTS 5,367,404  11/1994  Hayata ........................... 359/558

*Primary Examiner*—Arthur T. Grimley
*Assistant Examiner*—Herbert V. Kerner
*Attorney, Agent, or Firm*—Shapiro and Shapiro

[57] ABSTRACT

A projection exposure apparatus includes illuminating optical means for illuminating a projection negative, and projection optical means for projection-exposing the projection negative illuminated by the illuminating optical means onto a substrate, the illuminating optical means including light source means for supplying exposure light, annular light source forming means for forming an annular secondary light source by the light from the light source means, and condenser means for condensing the light beam from the annular light source forming means on the projection negative, and is designed to satisfy the following condition:

$$1/3 \leq d_1/d_2 \leq 2/3,$$

where $d_1$ is the inner diameter of the annular secondary light source, and $d_2$ is the outer diameter of the annular secondary light source.

8 Claims, 8 Drawing Sheets

PROJECTION EXPOSURE APPARATUS

This is a continuation of application Ser. No. 08/370,216 filed Dec. 7, 1994, which is a continuation of application Ser. No. 08/274,369 filed Jul. 13, 1994 (abandoned), which is a continuation-in-part of application Ser. No. 08/166,153 filed Dec. 14, 1993 (abandoned), which is a continuation of application Ser. No. 07/991,421 filed Dec. 16, 1992 (abandoned).

BACKGROUND OF THE INVENTION

1. Field of the Invention

This invention relates to a projection exposure apparatus for projection-exposing minute patterns necessary for the manufacture of semiconductive integrated circuits or the like onto a substrate (wafer).

2. Related Background Art

As a prior-art projection exposure apparatus, there is known one in which exposure light is applied to a projection negative such as a mask or a reticle (hereinafter referred to as the reticle) on which a circuit pattern is formed, and the image of the circuit pattern on the reticle is transferred onto a substrate such as a wafer (hereinafter referred to as the wafer) through a projection optical system.

Here, resolving power representative of a line and space pattern transferred onto the wafer is theoretically of the order of $0.5 \times \lambda \times NA$ when the wavelength of the exposure light is $\lambda$ and the numerical aperture of the projection optical system is NA.

In the actual lithography process, however, a certain degree of depth of focus becomes necessary due to the influence of the curvature of the wafer, the level difference of the wafer by the process, etc. or the thickness of photoresist itself. Therefore, practical resolving power to which a factor such as the depth of focus has been added is expressed as $k \times \lambda \times NA$, where k is called a process coefficient and is usually of the order of 0.7–0.8.

Now, in recent years, particularly the tendency toward the minuteness of patterns transferred onto wafers is advancing and as a technique for coping with this tendency toward the minuteness, it is conceivable to shorten the wavelength of exposure light or to increase the numerical aperture NA of the projection optical system, as is apparent from the above-expression of the resolving power.

However, in the technique of shortening the wavelength of exposure light, glass materials usable for the lenses of the projection optical system become limited with the shortening of the exposure light, and it is difficult to design a projection optical system in which aberrations have been sufficiently corrected, in such limited glass materials.

Also, in the technique of increasing the numerical aperture NA of the projection optical system, an improvement in resolving power can be surely achieved, but the depth of focus of the projection optical system is inversely proportional to the square of the numerical aperture NA of the projection optical system. Accordingly, the depth of focus decreases remarkably, and this is not preferable. Moreover, it is difficult to design a projection optical system which has a great numerical aperture NA and yet in which aberrations have been sufficiently corrected.

SUMMARY OF THE INVENTION

So, it is an object of the present invention to eliminate the above-noted problems and to provide a projection exposure apparatus in which the depth of focus of a projection optical system is improved, whereby in practical use, a circuit pattern on a reticle can be faithfully transferred onto a wafer with a higher resolution.

To achieve the above object, a projection exposure apparatus according to an embodiment of the present invention includes illuminating optical means for illuminating a projection negative, and projection optical means for projection-exposing the projection negative illuminated by the illuminating optical means onto a substrate, the illuminating optical means including light source means for supplying exposure light, annular light source forming means for forming an annular secondary light source by the light from said light source means, and condenser means for condensing the light beam from said annular light source forming means on the projection negative, and is designed to satisfy the following condition:

$$1/3 \leq d_1/d_2 \leq 2/3, \qquad (1)$$

where $d_1$ is the inner diameter of the annular secondary light source, and $d_2$ is the outer diameter of the annular secondary light source.

As described above, the projection exposure apparatus according to an embodiment of the present invention is designed to illuminate the reticle by the exposure light from the light source means, i.e., effect so-called annular illumination (or inclined illumination).

At this time, the annular secondary light source of the annular light source forming means is designed to satisfy the above-mentioned conditional expression (1), whereby the depth of focus of projection means can be improved to achieve an improvement in practical resolution.

When as an example, the wavelength $\lambda$ of light source means is i-line (365 nm) and the wafer side numerical aperture NA of a projection lens is 0.4, the line width which can be resolved by a prior-art exposure apparatus in which the process coefficient is 0.7 is of the order of 0.64 μm from $k \times \lambda / NA$, while in the projection exposure apparatus according to an embodiment of the present invention, the process coefficient k is of the order of 0.5 and therefore, the line width which can be resolved is 0.46 μm. Thus, it will be seen that in the projection exposure apparatus according to the present invention, an improvement in resolution after a practically more sufficient depth of focus than in the prior-art apparatus has been secured is achieved.

If the lower limit of the above condition (1) is exceeded, the inner diameter of the annular second light source becomes too small, and the effect or advantage caused by the annular illumination according to the invention is reduced so that it is difficult to improve depth of focus as well as resolution of the projection optical system.

If the upper limit of the condition (1) is exceeded, the width of each line forming a pattern or patterns on a reticle, which width is uniform and the same, becomes uneven or varied depending on repetition of the lines or line-to-line distances of the pattern when transferred onto the wafer, and accordingly it is not possible to transfer the pattern on the reticle onto the wafer accurately.

Further, if the upper limit of the condition (1) is exceeded, change in line width for change in exposure amount is enlarged and it is difficult to form a pattern of a desired line width on the wafer.

Further, to sufficiently bring out the effect of annular illumination according to the present invention, it is desirable that when the projection negative side numerical aperture of the projection optical means is $NA_1$ and the numerical aperture of the illuminating optical means determined by the outer diameter of the annular secondary light source is NA$_2$, the projection exposure apparatus according to the present invention be designed to the following conditional expression (2):

$$0.45 \leq NA_2/NA_1 \leq 0.8 \tag{2}$$

If the lower limit of this conditional expression (2) is exceeded, the angle of incidence of the light which inclination-illuminates the reticle by annular illumination will become small and the effect of annular illumination according to the present invention can hardly be obtained. Therefore, effecting annular illumination will become meaningless in itself.

If conversely, the upper limit of conditional expression (2) is exceeded, the resolution as a spatial image will be improved, but the depth of focus will be reduced. Further, the contrast at the best focus will be greatly reduced, and this is not preferable.

As described above, in the projection exposure apparatus according to the present invention, a depth of focus greater than in the prior-art projection exposure apparatus can be secured and therefore, exposure under a practically higher resolution can be realized. Thereby, more minute patterns than in the prior-art projection exposure apparatus can be transferred onto wafers.

Other objects, features and effects of the present invention will become fully apparent from the following detailed description taken in conjunction with the accompanying drawings.

DESCRIPTION OF THE PREFERRED EMBODIMENTS

Some embodiments of the present invention will hereinafter be described with reference to the drawings.

Figure 1:
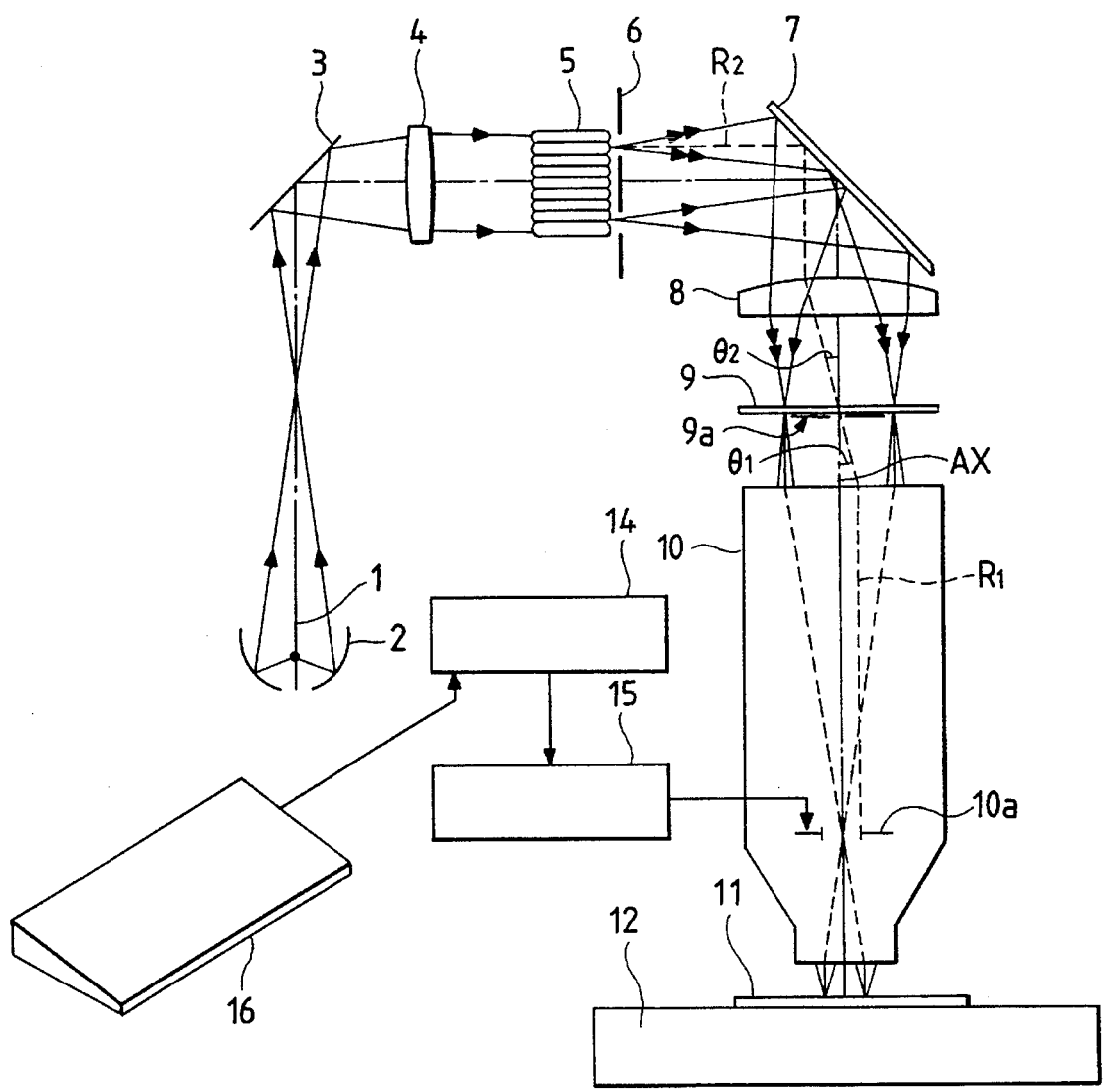
FIG. 1 is a schematic view schematically showing the construction of a first embodiment of the present invention.

FIG. 1 schematically shows the construction of a first embodiment of the present invention, and the first embodiment of the present invention will hereinafter be described in detail with reference to FIG. 1.

Light (for example, light of g-line (436 nm), i-line (365 nm) or the like) from a mercury arc lamp 1 is condensed by an elliptical mirror 2 and is converted into a parallel light beam by a collimator lens 4 via a reflecting mirror 3. Thereafter, when the parallel light beam passes through a fly-eye lens 5 (optical integrator) comprised of an aggregate of a plurality of bar-like lens elements, a plurality of light source images are formed on the exit side thereof corresponding to the number of the barlike lens elements constituting the fly-eye lens 5.

An aperture stop 6 having an annular transmitting portion is provided at a location whereat the light source images are formed, and here is formed an annular secondary light source.

Figure 2:
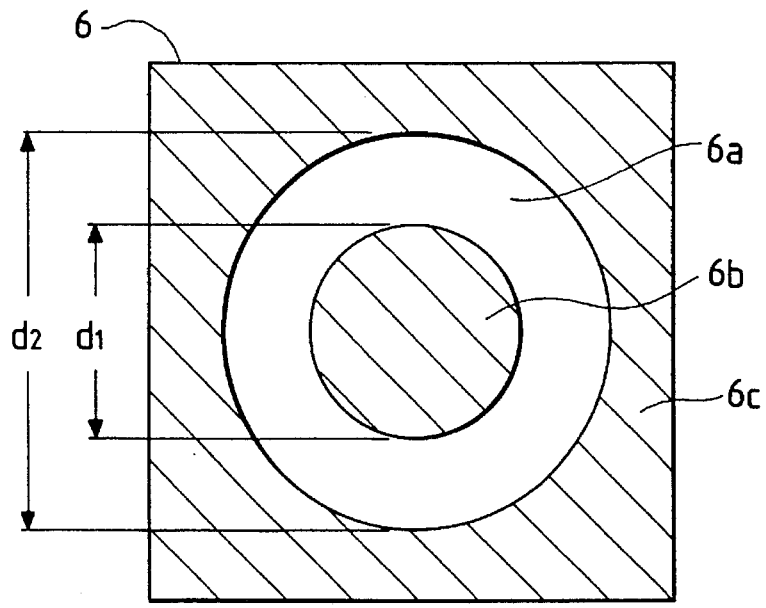
FIG. 2 is a plan view showing the construction of an aperture stop.

The aperture stop 6, as shown in FIG. 2, is formed by the deposition of light intercepting portions 6b and 6c of chromium or like material so that for example, an annular transmitting portion 6a may be formed on a transparent substrate such as quartz. Alternatively, the aperture stop 6 may be comprised of a circular light intercepting member and a light intercepting member having a circular opening larger than that.

When here, the diameter of the light intercepting member 6b of the aperture stop 6 (the inner diameter of the annular transmitting portion 6a) is $d_1$ and the diameter of the light intercepting member 6c of the aperture stop 6 (the outer diameter of the annular transmitting portion 6a) is $d_2$ and $d_1/d_2$ is defined as an annular ratio, the annular ratio of the aperture stop 6 is designed within a range of 1/3 to 2/3.

Now, the light from the annular secondary light source formed by the aperture stop 6 is condensed by a condenser lens 8 via a reflecting mirror 7 and superposedly uniformly illuminate a circuit pattern 9a on a reticle 9 from an oblique direction. Thereupon, the image of the circuit pattern on the reticle 9 is formed on the exposure area of a wafer 11 by a projection optical system 10. Accordingly, resist applied onto the wafer 11 is sensitized and the image of the circuit pattern on the reticle 9 is transferred thereto.

Thereafter, the projection exposure apparatus drives a stage 12 on which the wafer 11 is placed, and moves the wafer 11 so that the circuit pattern can be transferred to an area discrete from the aforementioned exposure area. The illuminated circuit pattern on the reticle 9 is then transferred by the projection optical system 10. In this manner, the projection exposure apparatus transfers circuit patterns in succession onto the wafer 11.

An aperture stop 10a is provided at the position of the pupil (entrance pupil) of the projection optical system 10, and this aperture stop 10a is provided conjugately with the aperture stop 6.

Figure 3:
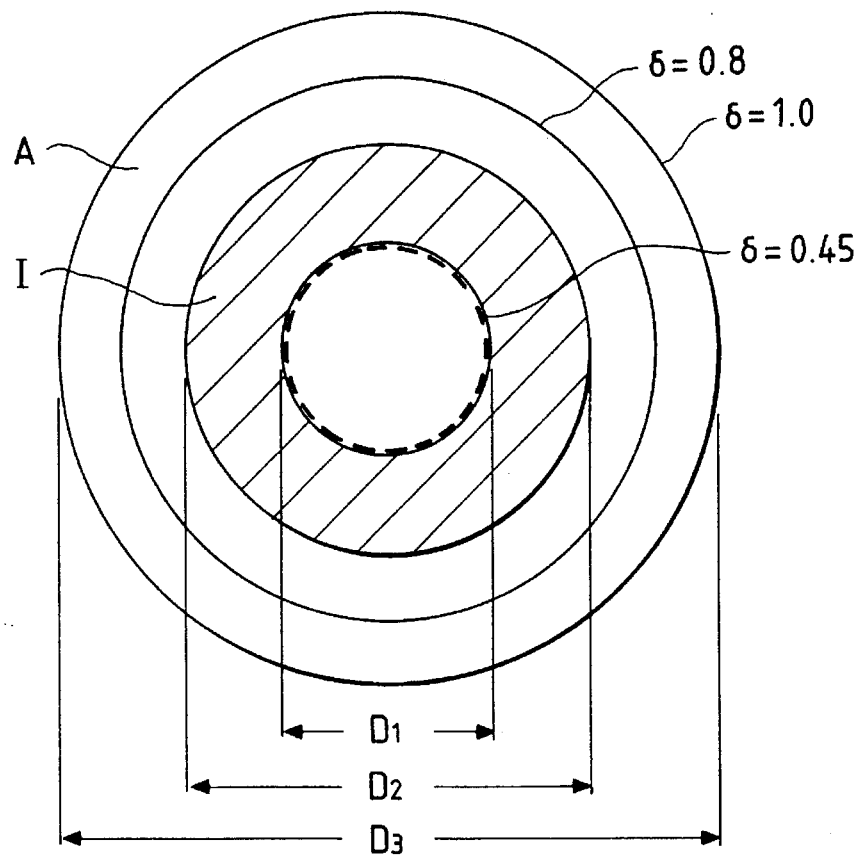
FIG. 3 shows the opening portion of an aperture stop provided at the pupil position of a projection optical system.

FIG. 3 shows the state of the circular opening portion P of the aperture stop 10a, and as shown, the image I of the annular secondary light source is formed inside the opening portion A of the aperture stop 10a, and the annular ratio of the image I of this secondary light source (the inner diameter $D_1$ of the image of the secondary light-source/the outer diameter $D_2$ of the image of the secondary light source) is equal to the above-mentioned annular ratio of the aperture stop 6.

When here, the diameter of the opening portion of the aperture stop 10a is $D_3$, the ratio ($D_2/D_3$) of the outer diameter of the image of the secondary light source to the diameter of the opening portion A of the aperture stop 10a is called a coherence factor, i.e., σ value, and at this time, the image I of the annular secondary light source is formed within the range of the σ value of 0.45 to 0.8, as shown in FIG. 3.

When as shown in FIG. 1, the reticle side numerical aperture of the projection optical system 10 determined by a ray $R_1$ from the most marginal edge of the aperture stop 10a which is parallel to the optical axis Ax is $NA_1$ $(=\sin \theta_1)$ and the numerical aperture of the illuminating optical system (1–8) determined by a ray $R_2$ from the most marginal edge (the outermost diameter) of the aperture stop 6 which is parallel to the optical axis Ax is $NA_2$ $(=\sin \theta_2)$, the $\sigma$ value is also defined by the following equation:

$$\sigma = NA_2/NA_1$$

Now, in the process of printing a circuit pattern on the wafer 11, there are various processes such as a process in which the printing of a minute pattern is required, and a process in which a great depth of focus is required, and the optimum depth of focus and resolution in each of these processes are found.

Therefore, in the present embodiment, the aperture of the aperture stop 10a is variably designed and the $\sigma$ value is varied to thereby control the depth of focus and resolution on the wafer 11.

A desired depth of focus and resolution are first input by means of an input portion 16 such as a keyboard. A control portion 14 determines the $\sigma$ value on the basis of this input information, and controls a driving portion 15 for varying the aperture of the aperture stop 10a. The driving portion 15 varies the diameter of the opening portion A of the aperture stop 10a and changes the $\sigma$ value.

Figure 4:
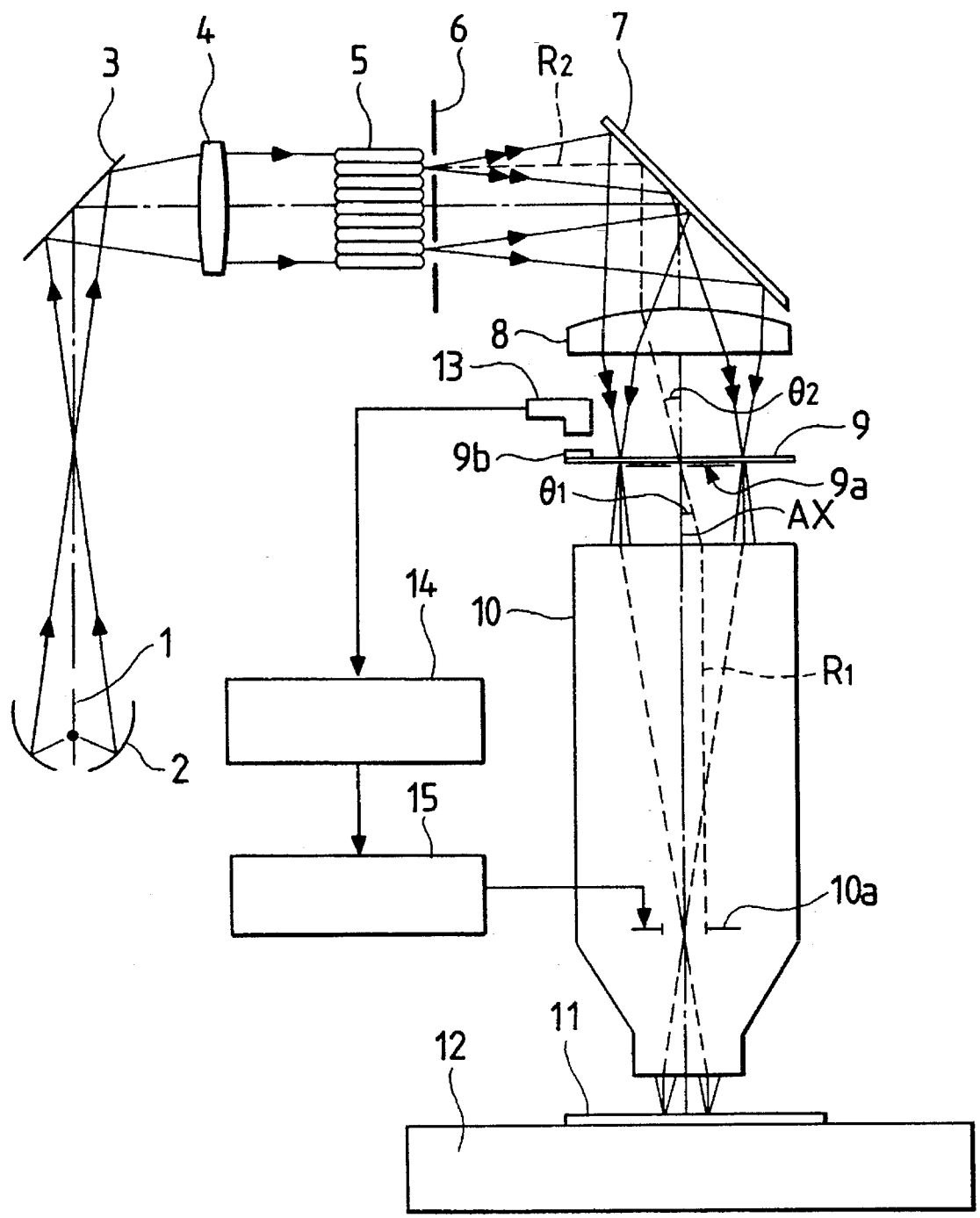
FIG. 4 schematically shows a modification of the first embodiment of the present invention.

Also, as shown in FIG. 4, a mark 9b such as a bar code including process information, the information of the desired depth of focus and information regarding a minimum line width on the wafer 11 may be provided on the reticle 9, and a mark detecting portion 13 for detecting this mark 9b may be provided. In this case, the control portion 14 determines the $\sigma$ value on the basis of information detected by the mark detecting portion 13.

As described above, in the present embodiment, annular illumination is effected by the disposition of the aperture stop 6 and therefore, greater improvements in the depth of focus and resolution can be achieved. Further, the $\sigma$ value is variable and therefore, an optimum illuminating condition conforming to each process can be achieved.

Figure 5:
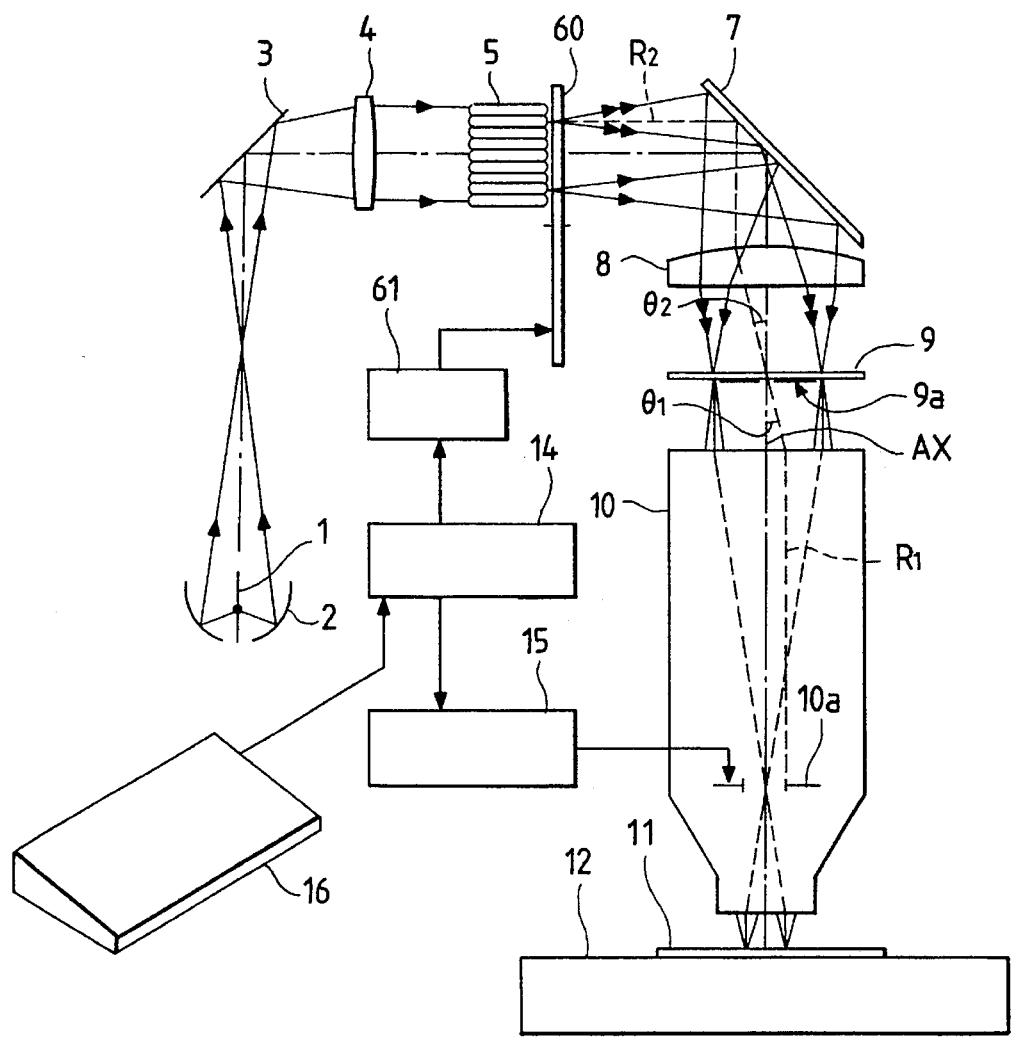
FIG. 5 schematically shows the construction of a second embodiment of the present invention.

Also, in the embodiments shown in FIGS. 1 and 4, the aperture stop 6 is fixedly used, but the annular ratio of this aperture stop 6 may be varied. FIG. 5 is a schematic view schematically showing the construction of a second embodiment in which a plurality of aperture stops differing in annular ratio from one another are provided along the circumferential direction of a circular substrate (turret).

In FIG. 5, for the simplicity of illustration, members functionally similar to those in the first embodiment shown in FIG. 1 are given the same reference characters.

Figure 6:
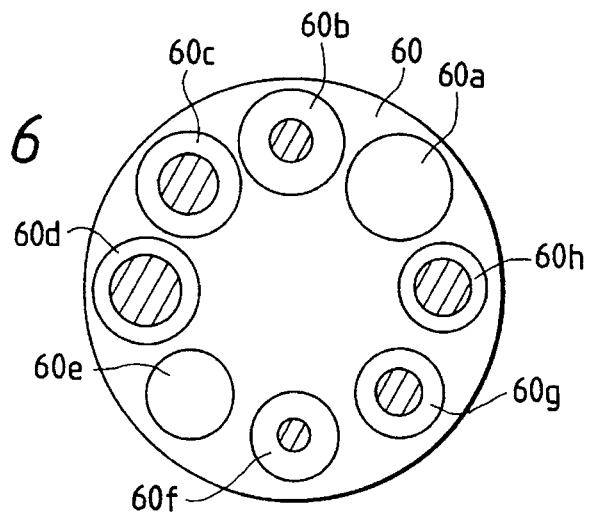
FIG. 6 shows the construction of a turret in the second embodiment of the present invention.

Only the differences of the second embodiment from the first embodiment will hereinafter be described in detail. In the projection exposure apparatus shown in FIG. 5, a circular substrate 60 provided with a plurality of aperture stops having different annular ratios is provided at a position on the exit side of the fly-eye lens 5 whereat a plurality of light source images are formed. As shown in the plan view of FIG. 6, a first group of aperture stops (60b–60c) having different annular ratios within a range of 1/3–2/3 and a second group of aperture stops (60f–60h) having an outer diameter differing from that of the first group of aperture stops and having different annular ratios within a range of 1/3–2/3 are provided on the transparent circular substrate 60 by the deposition of chromium or the like. Further, a circular aperture stop 60a having the same diameter as the outer diameter of the first group of aperture stops and a circular aperture stop 60e having the same diameter as the outer diameter of the second group of aperture stops are provided on the circular substrate 60.

In the present embodiment, the aperture stops (60b–60c, 60f–60h) having optimum annular ratios are set on the exit side of the fly-eye lens 5 and the depth of focus and resolution on the wafer 11 are controlled.

Turning back to FIG. 5, the control of the above-mentioned depth of focus and resolution will hereinafter be described in detail.

Process information and information regarding the required depth of focus and minimum line width are input by the use of the input portion 16 such as a keyboard.

On the basis of such input information, the control portion 14 selects one of the aperture stops (60b–60c, 60f–60h). The control portion 14 then controls a driving portion 61 for driving the circular substrate 60 so that the selected one of the aperture stops (60b–60c, 60f–60h) may be positioned on the exit side of the fly-eye lens 5.

Thereby, the depth of focus and resolution on the wafer 11 can be controlled and therefore, optimum annular illumination under an optimum $\sigma$ value can be accomplished. Also, if the aperture stops (60a, 60e) having a usual circular opening are set on the exit side of the fly-eye lens 5, exposure by usual illumination can be accomplished.

Figure 7:
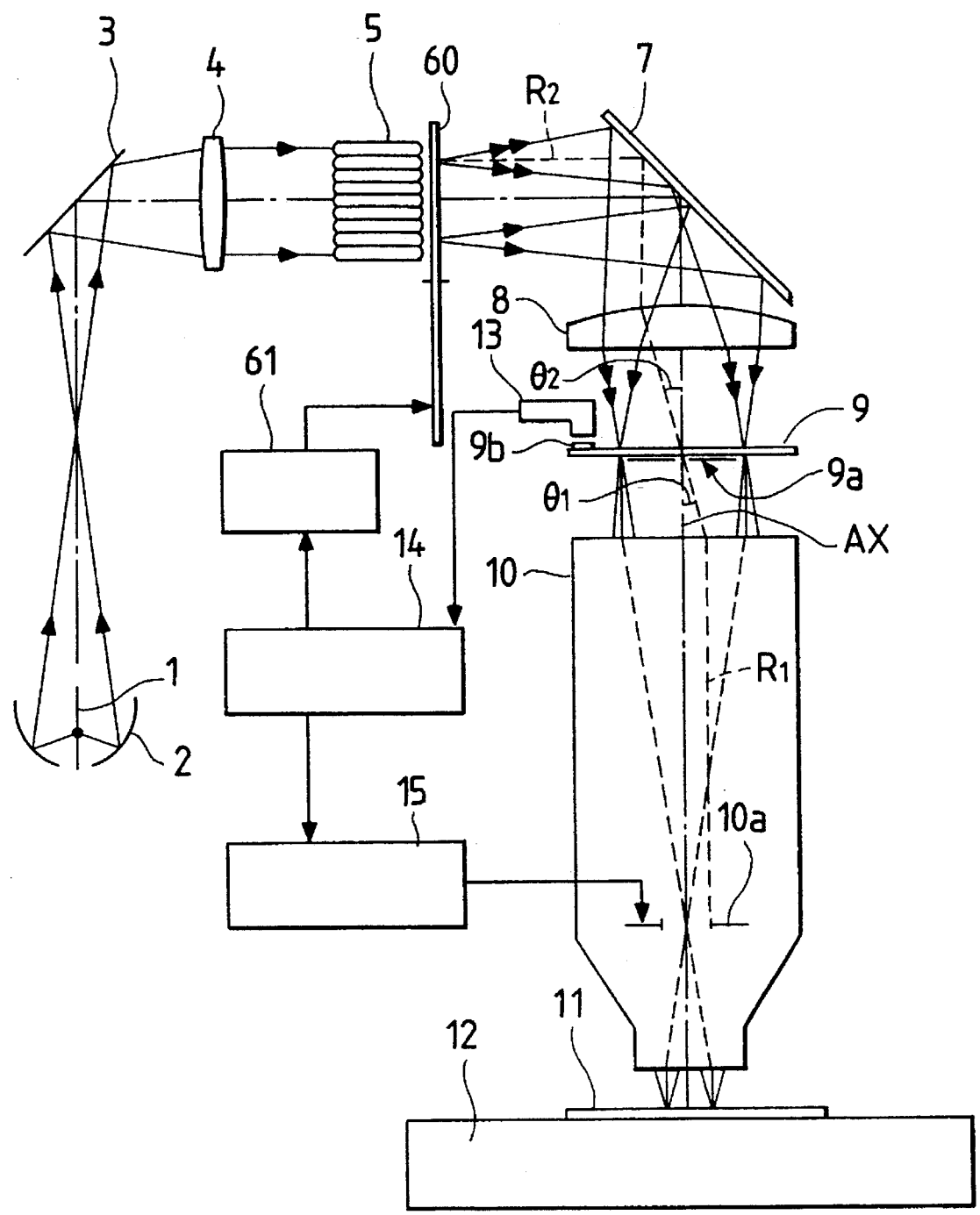
FIG. 7 schematically shows a modification of the second embodiment of the present invention.

Also, as shown in FIG. 7, a mark 9b such as a bar code including process information and information regarding the desired depth of focus and minimum line width on the wafer 11 may be provided on the reticle 9 and a mark detecting portion 13 for detecting this mark 9b may be provided. In such case, the control portion 14 selects one of the aperture stops (60b–60c, 60f–60h) on the basis of information detected by the mark detecting portion 13.

Figure 8:
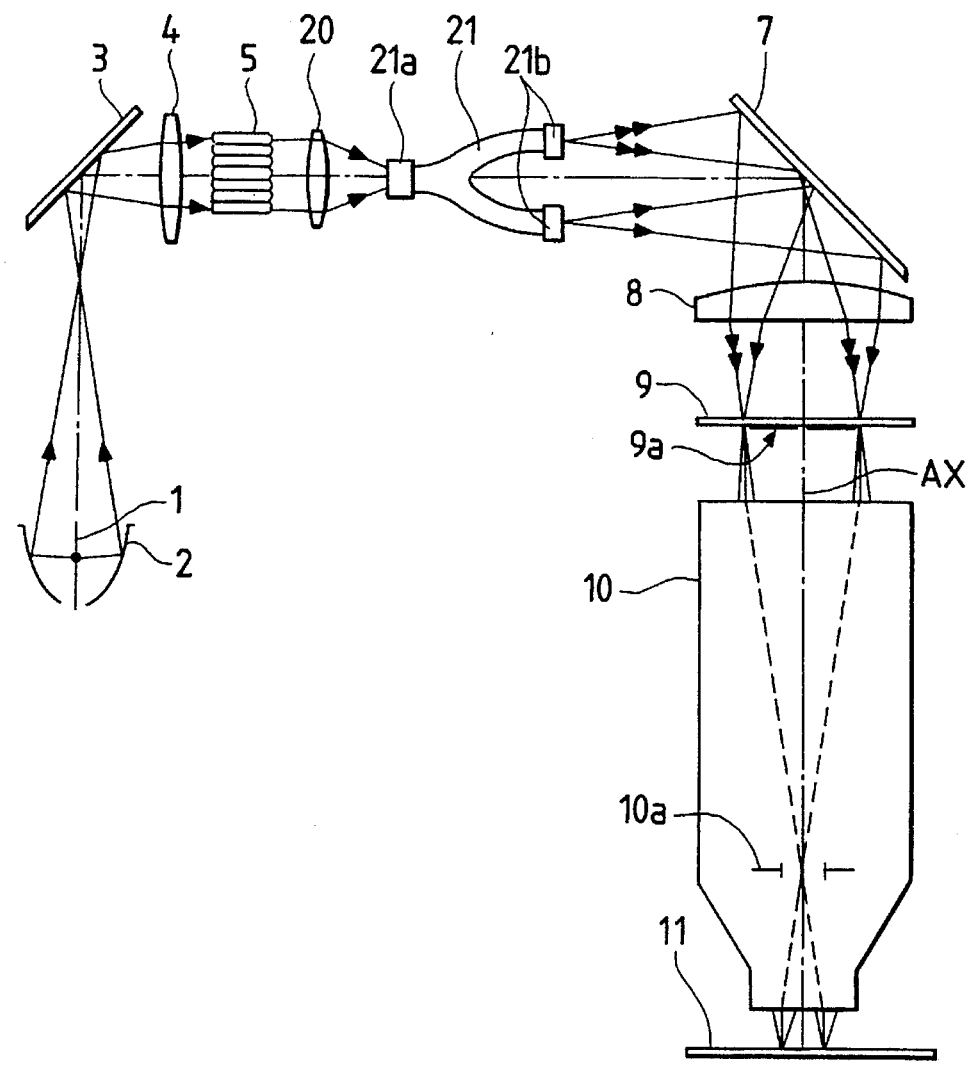
FIG. 8 is a schematic view schematically showing the construction of a third embodiment of the present invention.

A third embodiment of the present invention will now be described with reference to FIGS. 8 and 9. FIG. 8 is a schematic view schematically showing the construction of the third embodiment of the present invention. For simplicity of illustration, members functionally similar to those in the first embodiment of FIG. 1 are given the same reference characters.

The difference of the third embodiment from the first embodiment is that instead of the aperture stop 6 provided between the fly-eye lens 5 and the reflecting mirror 7, there are provided a condensing lens 20 and a light guide 21 comprised of a plurality of optical fibers having their entrance sides bundled into a circular shape and having their exit sides bundled into an annular shape, and a number of annular light sources are formed without intercepting a light beam from the fly-eye lens 5.

In the third embodiment of FIG. 8, a plurality of light source images are formed on the exit side of the fly-eye lens 5 by the light from the mercury arc lamp 1 through the intermediary of the elliptical mirror 2, the reflecting mirror 3, the collimator lens 4 and the fly-eye lens 5 in succession. Since the exit end of the fly-eye lens 5 and the exit end of the light guide 21 are made into a conjugate relation by the condensing lens 20, an annular secondary light source is formed at the exit end of the light guide 21.

Figure 9:
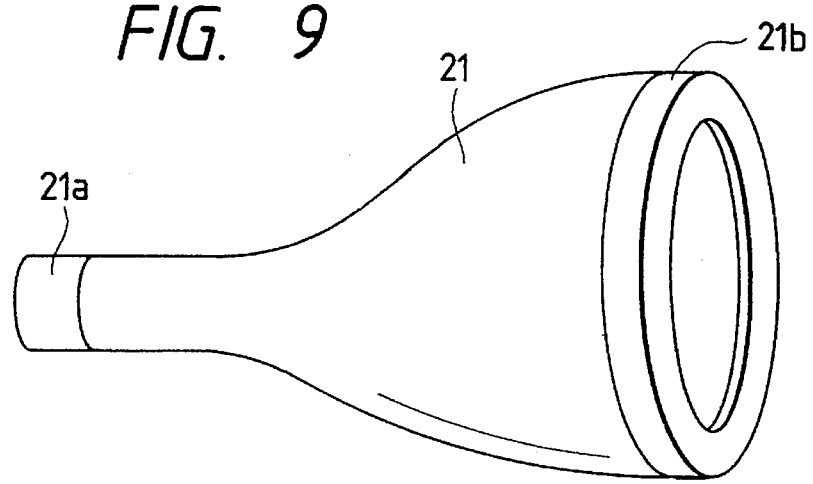
FIG. 9 is a schematic view showing a light guide in the third embodiment of the present invention.

As shown in FIG. 9, a circular member 21a for bundling a plurality of fibers is provided at the entrance end of the light guide 21 and an annular member 21b for bundling the plurality of fibers into an annular shape is provided at the exit end of the light guide.

The ratio of the inner diameter of the exit end of the light guide 21 to the outer diameter of the exit end of the light guide 21, i.e., the annular ratio, is designed so as to be 1/3 to 2/3, and as shown in FIG. 3, an annular light source image of which the σ value is of the order of 0.45 to 0.8 is formed at the position of the aperture stop 10a of the projection optical system.

By the above-described construction, in the present embodiment, annular illumination can be effected efficiently without intercepting the light from the light source 1 and therefore, not only greater improvements in the depth of focus and resolution can be achieved, but also exposure under a high throughput can be accomplished.

Again in the present embodiment, as described above, means for detecting a mark including various kinds of information on the reticle may be provided and on the basis of the information detected thereby, the optimum diameter of the opening portion of the aperture stop 10a may be set, and annular illumination under an optimum σ value may be effected.

Further, in the present embodiment, provision may be made of a plurality of light guides differing in annular ratio and outer diameter from one another and design may be made such that in conformity with the required depth of focus and resolution, one of the plurality of light guides is positioned between the condensing lens 20 and the condenser lens 8. Thereby, the depth of focus and resolution can be controlled without the illumination efficiency being reduced and optimum annular illumination under an optimum σ value can be accomplished.

Of course, an excimer laser (KrF: 248 nm, ArF: 193 nm, etc.) may be used as the light source of the projection exposure apparatus according to the present embodiment.

Figure 10:
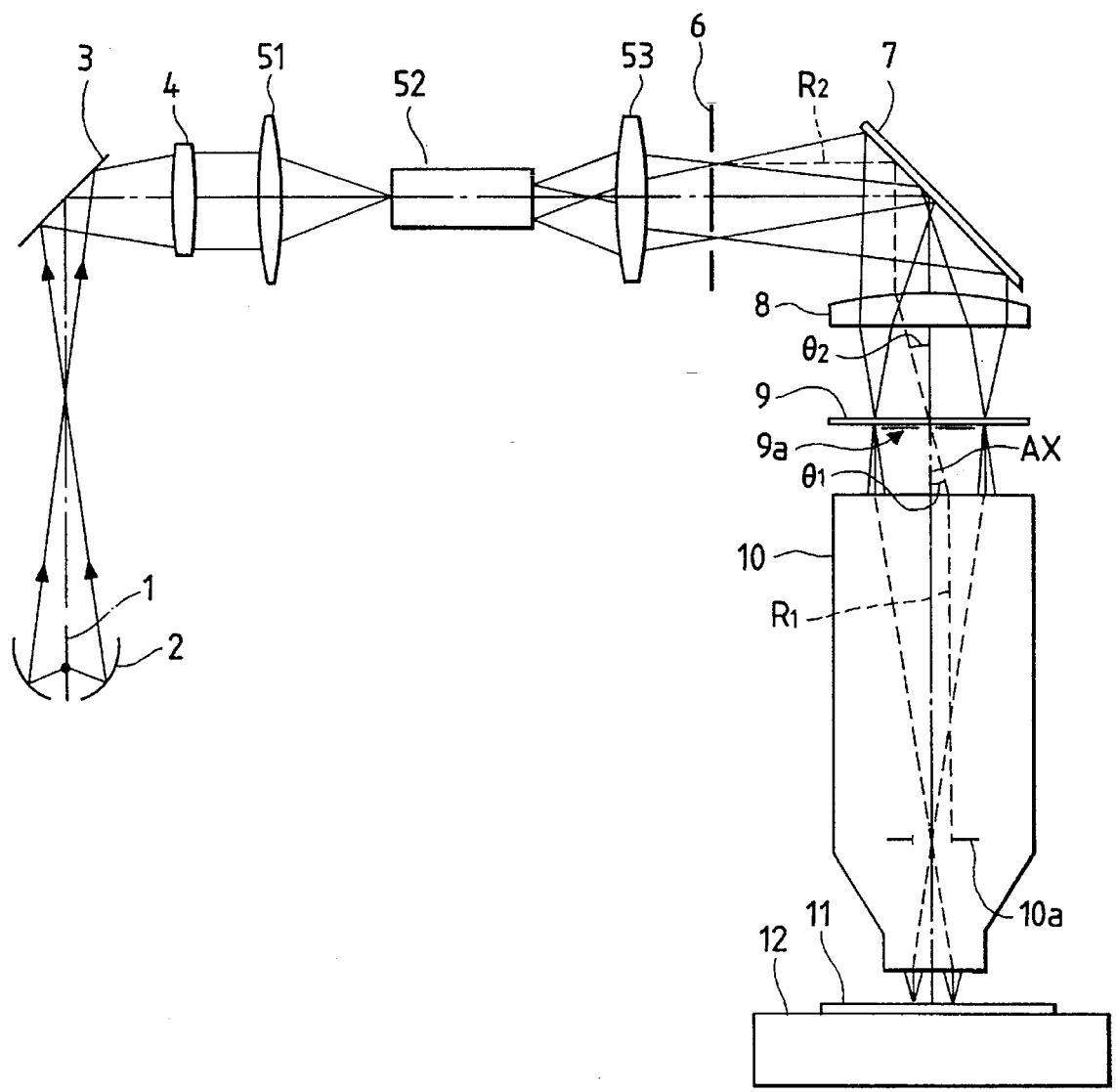
FIG. 10 shows a modification of the first embodiment of the present invention.

Also, in the embodiment shown in FIG. 1, the fly-eye lens 5 is used as the optical integrator, but this is not restrictive. For example, as shown in FIG. 10, a bar-like optical element 52 may be employed as the optical integrator. This bar-like optical element 52 is constructed of glass formed into a bar-like shape, or is constructed such that the inner surface of a prismatic or cylindrical barrel is a reflecting surface. The parallel light beam from the mercury arc lamp 1 passed via the elliptical mirror 2, the reflecting mirror 3 and the collimator lens 4 is condensed on the entrance surface of the bar-like optical element 52 by a lens 51 and repeats reflection on the inner surface of this bar-like optical element 52, thereby emerging from the bar-like optical element 52 with a uniform illumination distribution. This emergent light forms a light source image on the aperture stop 6 by a lens 53 provided on the exit side of the bar-like optical element 52. Thereby, an annular secondary light source is formed on the aperture stop 6.

Figure 11:
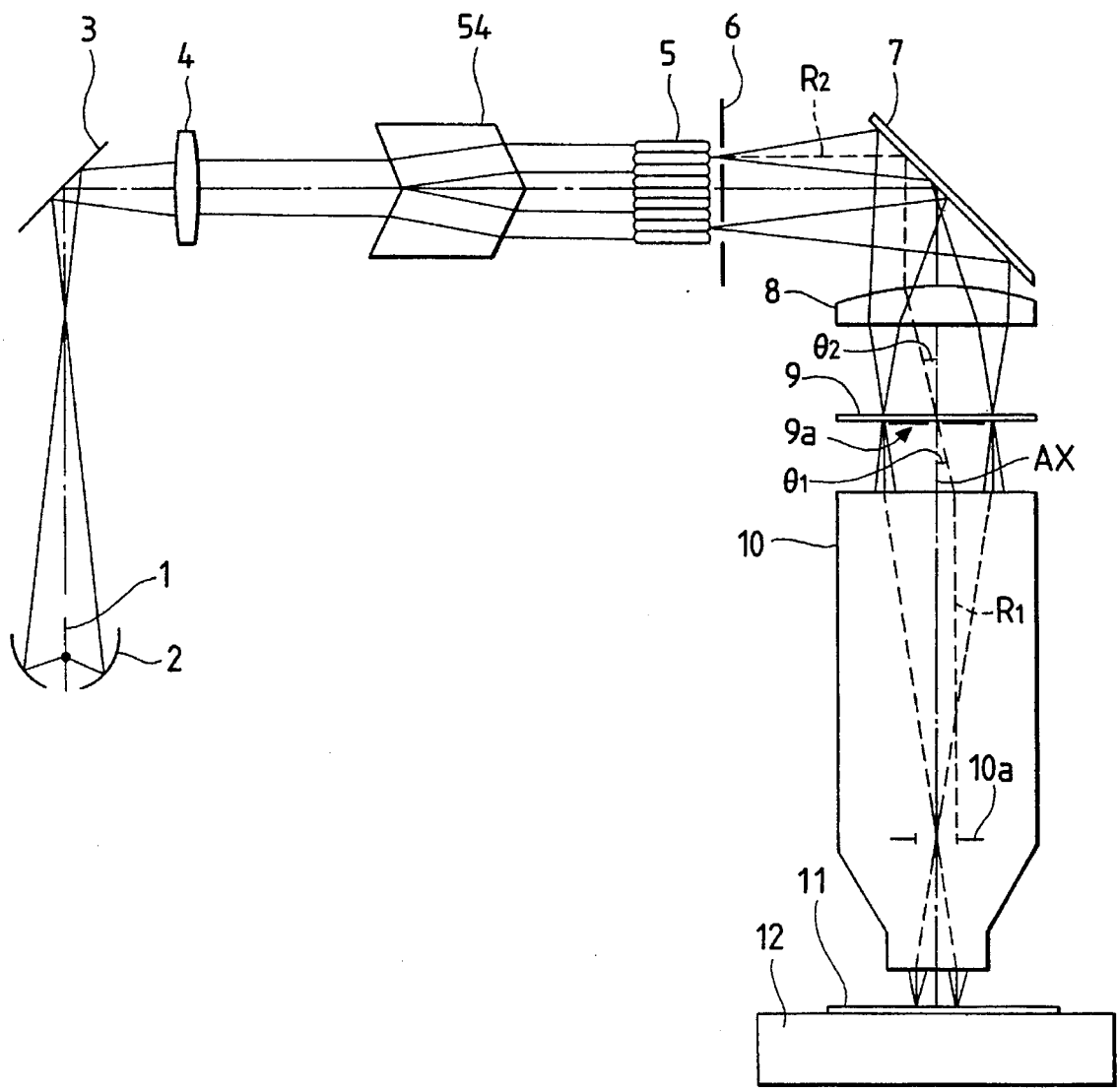
FIG. 11 shows a modification of the first embodiment of the present invention.

In the embodiment shown in FIG. 1, a prism member such as a cone lens 54 of which the entrance side surface and the exit side surface are conical surfaces, as shown, for example, in FIG. 11, may be disposed in the optical path from the collimator lens 4 to the fly-eye lens 5. Thereby, the light beam entering the fly-eye lens 5 is made into a parallel light beam of which the cross-sectional shape is annular, and an annular secondary light source is formed on the exit surface of the fly-eye lens 5. Thus, an annular secondary light source can be provided without involving a reduction in the efficiency of the quantity of light.

In the embodiment shown in FIG. 11, the cone lens 54 may be divided by a plane perpendicular to the optical axis. In other words, the cone lens 54 may be formed or replaced by two optical elements, one being an optical element whose light incident side (end) has a conically recessed surface and whose light exit side (end) has a flat plane surface, and the other being an optical element which has a flat plane end surface at a light incident side and a conically projected end surface at a light exit side, and both of these elements being arranged between the collimator lens 4 and the fly-eye lens 5. Such an arrangement may form an annular secondary light source at a light exit plane of the fly-eye lens 5. By changing a distance along the optical axis between those two optical elements, an annular ratio of the secondary light source formed on the exit plane of the fly-eye lens 5 can be changed.

Further, in the embodiment shown in FIG. 1, design may be made such that the inner diameter and outer diameter of the aperture stop, 6 are variable, and this aperture stop 6 may be disposed at any location which is conjugate with the position at which the secondary light source is formed. For example, it is also conceivable to dispose a stop of which the diameter of the opening portion is variable on the exit surface side of the fly-eye lens 5, dispose a stop of which the diameter of the light intercepting portion is variable at a location conjugate with the exit surface of the fly-eye lens, and vary the annular ratio and σ value of the annular secondary light source.

In the above described embodiments, the aperture stop may be formed by a transparent type liquid crystal display device, an electrochromic device or the like.

What is claimed is:

1. A projection exposure apparatus including:

an illuminating optical system; and a projection optical system, said illuminating optical system including a light source, an optical integrator, a first annular stop, a second annular stop and a condenser optical system;

said projection optical system including an aperture stop;

light from said light source passing through said optical integrator, said condenser optical system, a projection negative and said projection optical system and onto a substrate;

said first and second annular stops satisfying the following condition:

$$1/3 \leq d_1/d_2 \leq 2/3$$

where $d_1$ is an inner diameter of aperture portions of said annular stops and $d_2$ is an outer diameter of aperture portions of said annular stops;

said first and second annular stops being selectively disposed at a position of an annular secondary light source comprising a plurality of light source images formed by said illuminating optical system; and the aperture stop of said projection optical system and said first and second annular stops satisfying the following condition:

$$0.45 \leq NA_2/NA_1 \leq 0.8,$$

where $NA_1$ is the numerical aperture of said projection optical system at a side of said projection negative, and $NA_2$ is the numerical aperture of said illuminating optical system determined by an outer diameter of said annular secondary light source.

2. A projection exposure apparatus including:

an illuminating optical system; and a projection optical system, said illuminating optical system including a light source, an optical integrator, a first annular stop, a second annular stop and a condenser optical system;

said projection optical system including an aperture stop of which diameter of an aperture is variable;

light from said light source passing through said optical integrator, said condenser optical system, a projection negative and said projection optical system, and onto a substrate;

said first and second annular stops satisfying the following condition:

$$1/3 \leq d_1/d_2 \leq 2/3$$

where $d_1$ is an inner diameter of aperture portions of said annular stops and $d_2$ is an outer diameter of aperture portions of said annular stops;

said first and second annular stops being disposed selectively at a position of an annular secondary light source comprising a plurality of light source images formed by said illuminating optical system; and said first and second annular stops and the aperture stop of said projection optical system satisfying the following condition:

$$0.45 \leq NA_2/NA_1 \leq 0.8,$$

where $NA_1$ is the numerical aperture of said projection optical system at a side of said projection negative, $NA_2$ is the numerical aperture of said illuminating optical system determined by an outer diameter of said annular secondary light source.

3. A projection exposure method including:

a first step of supplying exposure light from a light source;

a second step of guiding said exposure light to an optical integrator;

a third step of forming a secondary light source through said optical integrator;

a fourth step of making said secondary light source annular;

a fifth step of guiding light from said annular secondary light source to a projection negative in superposed manner through a condenser optical system;

a sixth step of forming an image of said annular secondary light source at an aperture stop of a projection optical system, based on light from said projection negative; and a seventh step of guiding light from the image to a substrate;

the following conditions being satisfied:

$$1/3 \leq d_1/d_2 \leq 2/3$$

$$0.45 \leq NA_2/NA_1 \leq 0.8$$

where $d_1$ is an inner diameter of said annular secondary light source, $d_2$ is an outer diameter of said annular secondary light source, $NA_1$ is the numerical aperture of said projection optical system at a side of said projection negative, and $NA_2$ is the numerical aperture of an illuminating optical system, in which the first through fifth steps are performed, determined by the outer diameter of said annular secondary light source.

4. A projection exposure method including:

a first step of supplying exposure light from a light source;

a second step of guiding said exposure light to an optical integrator;

a third step of forming a secondary light source by said optical integrator;

a fourth step of making said secondary light source annular;

a fifth step of guiding light from said annular secondary light source to a projection negative in superposed manner through a condenser optical system;

a sixth step of forming an image of said annular secondary light source at an aperture stop of a projection optical system, based on light from said projection negative; and a seventh step of guiding light from the image to a substrate;

wherein the fourth step of making said secondary light source annular is a step in which said secondary light source is made annular at a first ratio between an inner diameter and outer diameter of said annular light source or a step in which said secondary light source is made annular at a second ratio between an inner diameter and outer diameter of said annular secondary light source;

said first ratio and second ratio being different from each other, and said method satisfying the following conditions:

$$1/3 \leq d_1/d_2 \leq 2/3$$

$$0.45 \leq NA_2/NA_1 \leq 0.8$$

where $d_1$ is the inner diameter of said annular secondary light source, $d_2$ is the outer diameter of said annular secondary light source, $NA_1$ is the numerical aperture of said projection optical system at a side of said projection negative and $NA_2$ is the numerical aperture of an illuminating optical system, in which the first through fifth steps are performed, determined by the outer diameter of said annular secondary light source.

5. A projection exposure method including:

a first step of supplying exposure light from a light source;

a second step of guiding said exposure light to an optical integrator;

a third step of forming a secondary light source by said optical integrator;

a fourth step of making said secondary light source annular;

a fifth step of guiding light from said annular secondary light source to a projection negative in superposed manner through a condenser optical system;

a sixth step of forming an image of said annular secondary light source at an aperture stop of a projection optical system, based on light from said projection negative; and a seventh step of guiding light from the image to a substrate;

a ratio between an inner diameter and outer diameter of said annular secondary light source being variable, said projection exposure being performed under the following conditions:

$$1/3 \leq d_1/d_2 \leq 2/3$$

$$0.45 \leq NA_2/NA_1 \leq 0.8$$

where $d_1$ is an inner diameter of said annular secondary light source, $d_2$ is an outer diameter of said annular secondary light source, $NA_1$ is the numerical aperture of said projection optical system at a side of said projection negative, $NA_2$ is the numerical aperture of an illuminating optical system, in which the first through fifth steps are performed, determined by the outer diameter of said annular secondary light source.

6. A projection exposure method including:

a first step of supplying exposure light from a light source;

a second step of guiding said exposure light to an optical integrator;

a third step of forming a secondary light source by said optical integrator;

a fourth step of making said secondary light source annular;

a fifth step of guiding light from said annular secondary light source to a projection negative in superposed manner through a condenser optical system;

a sixth step of forming an image of said annular secondary light source at an aperture stop of a projection optical system, based on light from said projection negative; and a seventh step of guiding light from the image to a substrate, a ratio between an inner diameter and outer diameter of said annular secondary light source being variable, the diameter of the aperture stop of said projection optical system being variable, said projection exposure being performed under the following conditions:

$$1/3 \leq d_1/d_2 \leq 2/3$$

$$0.45 \leq NA_2/NA_1 \leq 0.8$$

where $d_1$ is an inner diameter of said annular secondary light source, $d_2$ is an outer diameter of said annular secondary light source, $NA_1$ is the numerical aperture of said projection optical system at a side of said projection negative, and $NA_2$ is the numerical aperture of an illuminating optical system, in which the first through fifth steps are performed, determined by the outer diameter of said annular secondary light source.

7. A projection exposure apparatus comprising:

an illuminating optical system; and a projection optical system, said illuminating optical system including a light source, an optical integrator, an annular stop, a circular aperture stop and a condenser optical system;

said projection optical system including an aperture stop;

light from said light source passing through said optical integrator, said condenser optical system, a projection negative and said projection optical system and onto a substrate;

said annular stop satisfying the following condition:

$$1/3 \leq d_1/d_2 \leq 2/3$$

where $d_1$ is an inner diameter of aperture portions of said annular stop and $d_2$ is an outer diameter of aperture portions of said annular stop;

said annular stop and said circular aperture stop being selectively disposed at a position of an annular secondary light source comprising a plurality of light source images formed by said optical integrator; and the aperture stop of said projection optical system and said annular stop satisfying the following condition:

$$0.45 \leq NA_2/NA_1 \leq 0.8$$

where $NA_1$ is the numerical aperture of said projection optical system at a side of said projection negative and $NA_2$ is the numerical aperture of said illuminating optical system determined by an outer diameter of said annular secondary light source image.

8. A projection exposure method comprising:

a first step of supplying exposure light from a light source;

a second step of guiding said exposure light to an optical integrator;

a third step of forming a secondary light source through said optical integrator;

a fourth step of making said secondary light source a predetermined shape;

a fifth step of guiding light from said predetermined shape secondary light source to a projection negative in superposed manner through a condenser optical system;

a sixth step of forming an image of said predetermined shape secondary light source at an aperture stop of a projection optical system, based on light from said projection negative; and a seventh step of guiding light from the image to a substrate;

wherein the fourth step of making said secondary light source a predetermined shape is a step in which said secondary light source is made annular or circular; said method satisfying the following conditions:

$$1/3 \leq d_1/d_2 \leq 2/3$$

$$0.45 \leq NA_2/NA_1 \leq 0.8,$$

where $d_1$ is an inner diameter of said annular secondary light source, $d_2$ is an outer diameter of said annular secondary light source, $NA_1$ is the numerical aperture of said projection optical system at a side of said projection negative and $NA2$ is the numerical aperture of an illuminating optical system, in which the first through fifth steps are performed, determined by the outer diameter of said annular secondary light source.

* * * * *